(12) United States Patent
Kerekes

(10) Patent No.: US 7,344,381 B2
(45) Date of Patent: Mar. 18, 2008

(54) HIGH FREQUENCY EDGE MOUNT CONNECTOR

(75) Inventor: Jim Kerekes, Waterville, MN (US)

(73) Assignee: Emerson Network Power Connectivity Solutions, Inc., Waseca, MN (US)

( * ) Notice: Subject to any disclaimer, the term of this patent is extended or adjusted under 35 U.S.C. 154(b) by 0 days.

(21) Appl. No.: 10/834,808

(22) Filed: Apr. 29, 2004

(65) Prior Publication Data

US 2005/0245110 A1    Nov. 3, 2005

(51) Int. Cl.
*H01R 12/00* (2006.01)
(52) U.S. Cl. ............................. 439/63; 439/581
(58) Field of Classification Search ................ 439/63, 439/578, 581, 675
See application file for complete search history.

(56) References Cited

U.S. PATENT DOCUMENTS

| | | | |
|---|---|---|---|
| 4,737,111 A | | 4/1988 | Minar et al. |
| 4,995,815 A | * | 2/1991 | Buchanan et al. ............ 439/63 |
| 5,404,117 A | | 4/1995 | Walz |
| 5,823,790 A | | 10/1998 | Magnuson |
| 5,897,384 A | | 4/1999 | Hosler, Sr. |
| 6,030,231 A | | 2/2000 | Särkiniemi |
| 6,106,304 A | | 8/2000 | Huang |
| 6,457,979 B1 | | 10/2002 | Dove et al. |
| 6,604,949 B2 | | 8/2003 | Oldfield |

OTHER PUBLICATIONS

K.C. Gupta et al., *Microchip Lines and Slotlines*, 1996, pp. 33-37, 433-436.
"How Can I Guild a Multi-Layer Construction with RO4003™ High Frequency Circuit Material?", downloaded from http://www.rogerscorporation.com/mwu/techtip2.htm on May 5, 2003.

* cited by examiner

Primary Examiner—Khiem Nguyen
(74) Attorney, Agent, or Firm—Sonnenschein Nath & Rosenthal LLP; Brian R. McGinley

(57) ABSTRACT

High frequency edge mount connector apparatus comprises a connector including a housing that forms an opening and a signal carrier in the housing allowing for low return loss and low insertion loss. The signal carrier has a pin which extends through the opening. The connector also includes an insulator in the housing and surrounding the signal carrier, wherein the insulator has a outer portion surrounding the pin and extending through the opening. By extending the insulator through the opening, a tight seal can be created when the connector is pressed against a circuit board. The seal allows for improved impedance matching for a signal traveling between the connector and the circuit board.

19 Claims, 14 Drawing Sheets

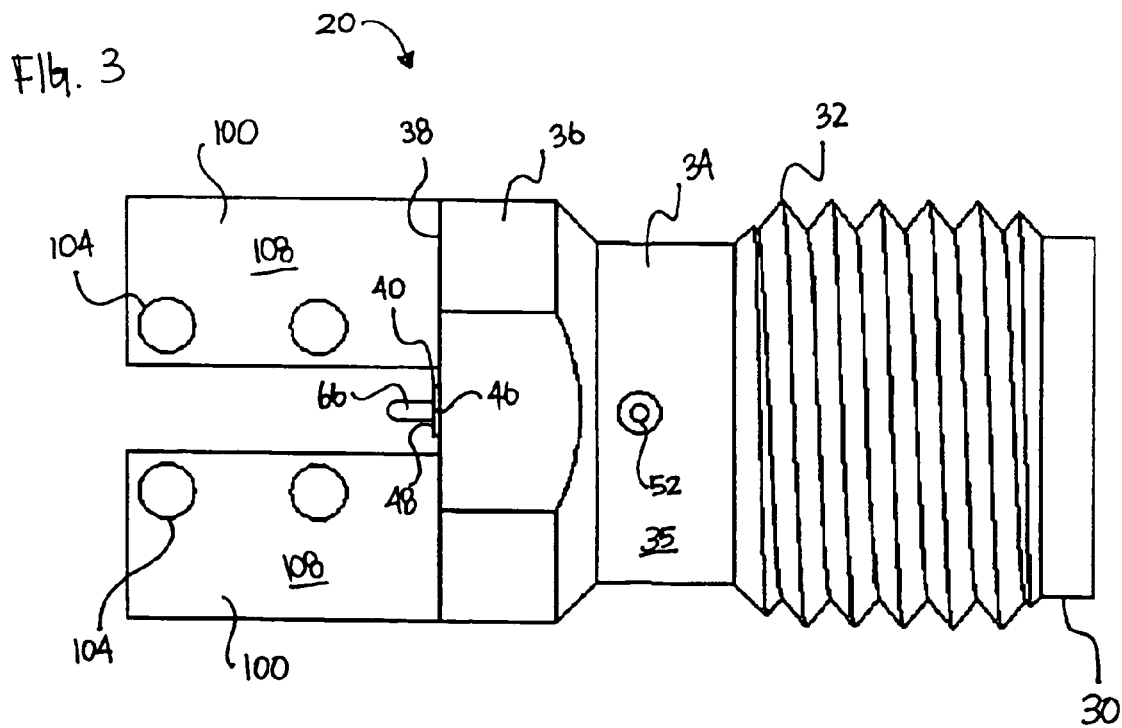
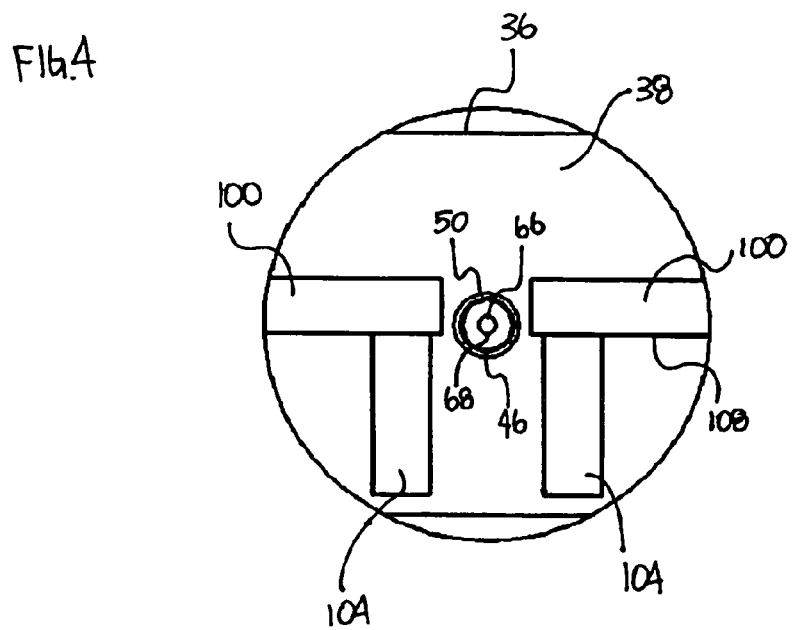

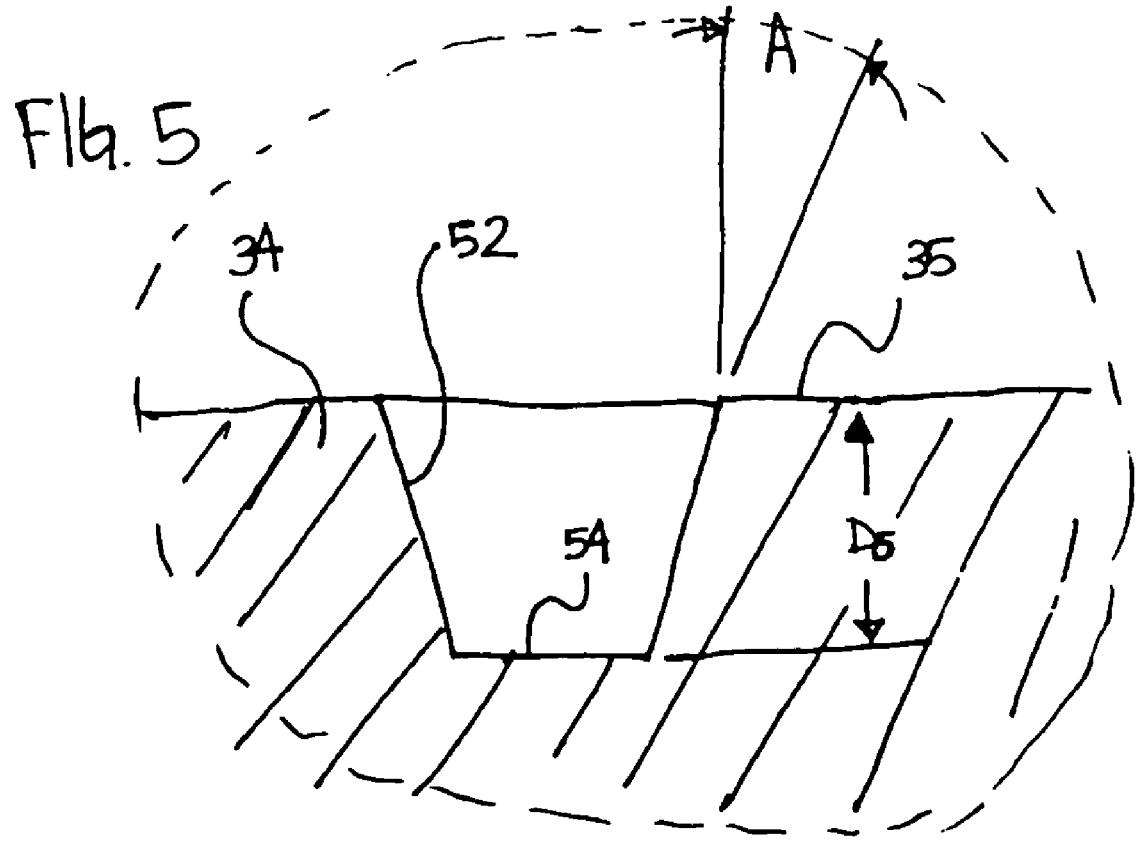

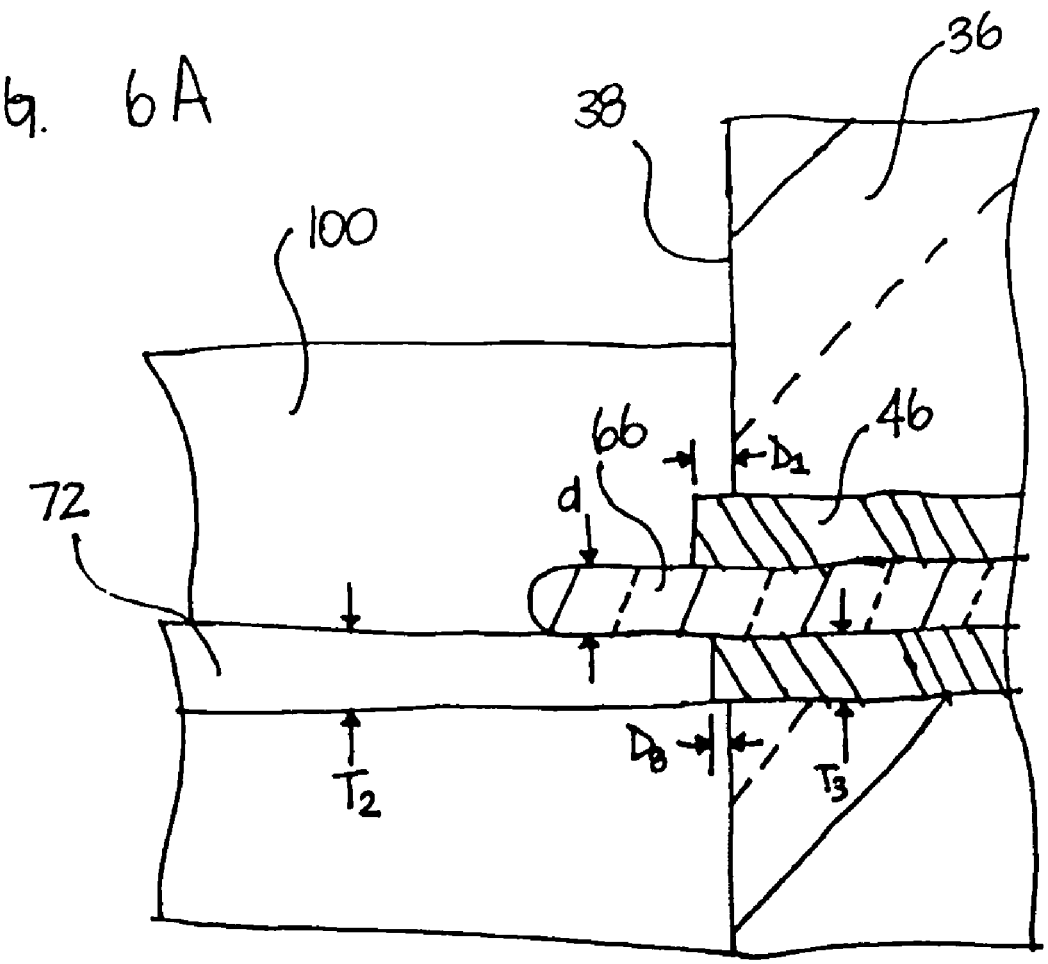

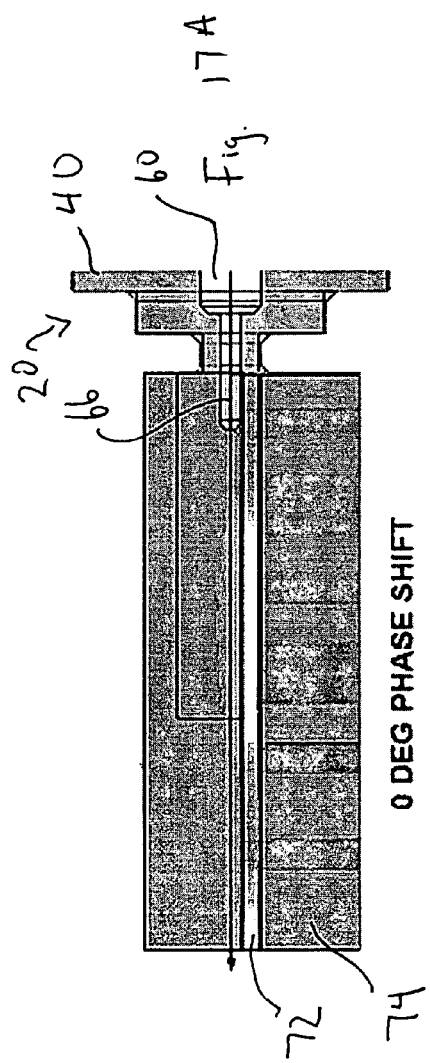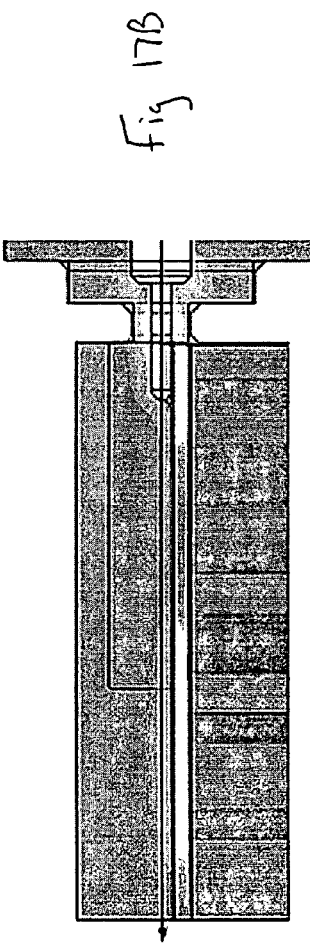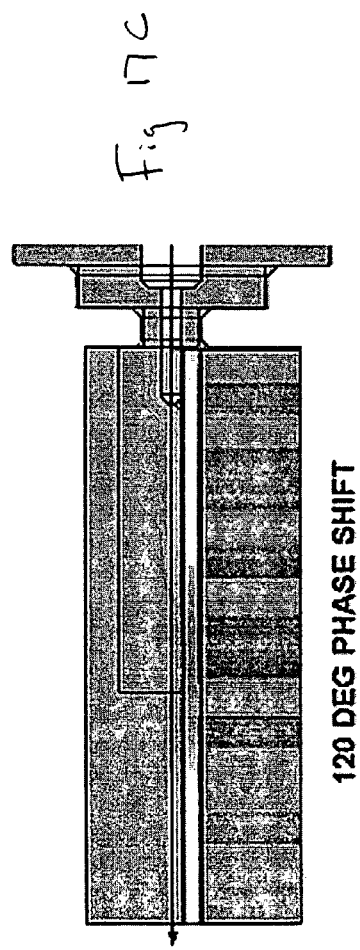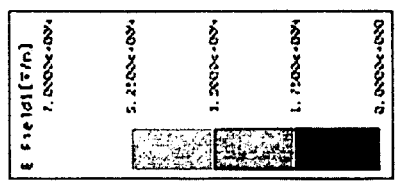
Fig. 17A — 0 DEG PHASE SHIFT
Fig. 17B — 60 DEG PHASE SHIFT
Fig. 17C — 120 DEG PHASE SHIFT

HIGH FREQUENCY EDGE MOUNT CONNECTOR

BACKGROUND OF THE INVENTION

This invention relates generally to connectors, and in particular, to a high frequency edge mount launch connector for transitioning coaxial to planar microwave signals.

High frequency edge mount launch connectors may be used to transition high frequency signals from coaxial to planar transmission line structures. High frequency signals include signals which are greater than 500 megahertz and extend up through the K-band, such as microwave signals. Applications which require the use of high frequency signals require unique connectors and circuit boards. Examples of some of these applications include cellular and pager linear power amplifiers, cellular handset filters, and DBS low-noise block down converters. High frequency signals typically consist of time varying electromagnetic fields which may be able to induce currents on metal surfaces.

In order to transition or "launch" high frequency signals from a cylindrically shaped coaxial cable to a planar circuit board signal trace, high frequency edge mount connectors may be used. In general, in-line edge mount connectors are preferred to "launch" the high frequency signals. One end of the edge mount connector is connected with a signal line which is used to carry a high frequency signal, such as a coaxial cable, while the other end of the edge mount connector includes a pin which extends from a housing of the connector. The pin is typically soldered to a signal trace of a circuit board in order to complete the connection and allow for a high frequency signal to travel down the signal line, through the edge mount connector, and to the circuit board. Additionally, the housing of the edge mount connector is connected with a ground located on the circuit board in order to complete the connection.

An accurate characterization of packaged high frequency circuits, such as Broadband MMIC power amplifiers, requires coaxial to planar transitions which have a low return loss. Therefore, as the wavelength of the high frequency signals decreases, the size of the pin on the edge mount connector needs to be reduced in order to minimize the return loss. Reducing the size of the pin, however, complicates the attachments of the pin to the signal trace of the circuit board. Since the pin is smaller, damage to the pin may occur if the pin is not handled properly when placed in contact with the signal trace. Additionally, aligning the pin on the signal trace is made more difficult when the pin is made smaller.

In addition to complicating the attachment of the pin to the circuit board, as the wavelength of the high frequency signals decreases, it becomes more difficult to achieve both low return loss and insertion loss when transitioning the high frequency signal from the signal line to the circuit board. For example, the high frequency signal becomes more sensitive to impedance mismatches between the edge mount connector and the circuit board.

It would be desirable to have an edge mount connector that is capable of "launching" high frequency signals from a cabled transmission signal line to a circuit board with a low return loss and insertion loss over a wide bandwidth, that has an in-line design which is more simple to fabricate, that allows for the a more accurate placement of the pin on a circuit board with reproducible results, that prevents damage to the pin, and that is adaptable to circuit board substrates of varying thicknesses.

BRIEF SUMMARY OF THE INVENTION

The present invention is defined by the following claims, and nothing in this section should be taken as a limitation on those claims. By way of introduction, the preferred embodiments described below relate to a high frequency edge mount connector. The edge mount connector includes a housing forming an opening. The present invention is capable of achieving both a low return loss and insertion loss. The connector includes a housing that forms an opening and a signal carrier in the housing. The signal carrier has a pin which extends through the opening. The connector also includes an insulator in the housing and surrounding the signal carrier, wherein the insulator has a outer portion surrounding the pin and extending through the opening. By extending the insulator through the opening, a tight seal can be created when the connector is pressed against a circuit board. The seal allows for improved impedance matching for a signal traveling between the connector and the circuit board.

These and other objects of the present invention will be classified in the following description of the preferred embodiment in connection with the drawings, the disclosure and the appended claims, wherein like reference numerals represent like elements throughout. The drawings constitute a part of this application and include exemplary embodiments of the present invention and illustrate various features thereof.

BRIEF DESCRIPTION OF THE DRAWINGS

FIG. 3 depicts a bottom view of the high frequency edge mount connector of FIG. 1, according to one embodiment.

FIG. 4 depicts an enlarged front view of the high frequency edge mount connector of FIG. 1, according to one embodiment.

FIG. 5 depicts an enlarged cross-sectional view of the high frequency edge mount connector of FIG. 2, according to one embodiment.

FIG. 6A depicts an enlarged cross-sectional view of the high frequency edge mount connector connected to the hybrid circuit board of FIG. 6, according to one embodiment.

FIGS. 17A, 17B, and 17C illustrate the electric field distribution of an 18 gigahertz (GHz) signal traveling through the connector at various phase shifts.

Figure 1:
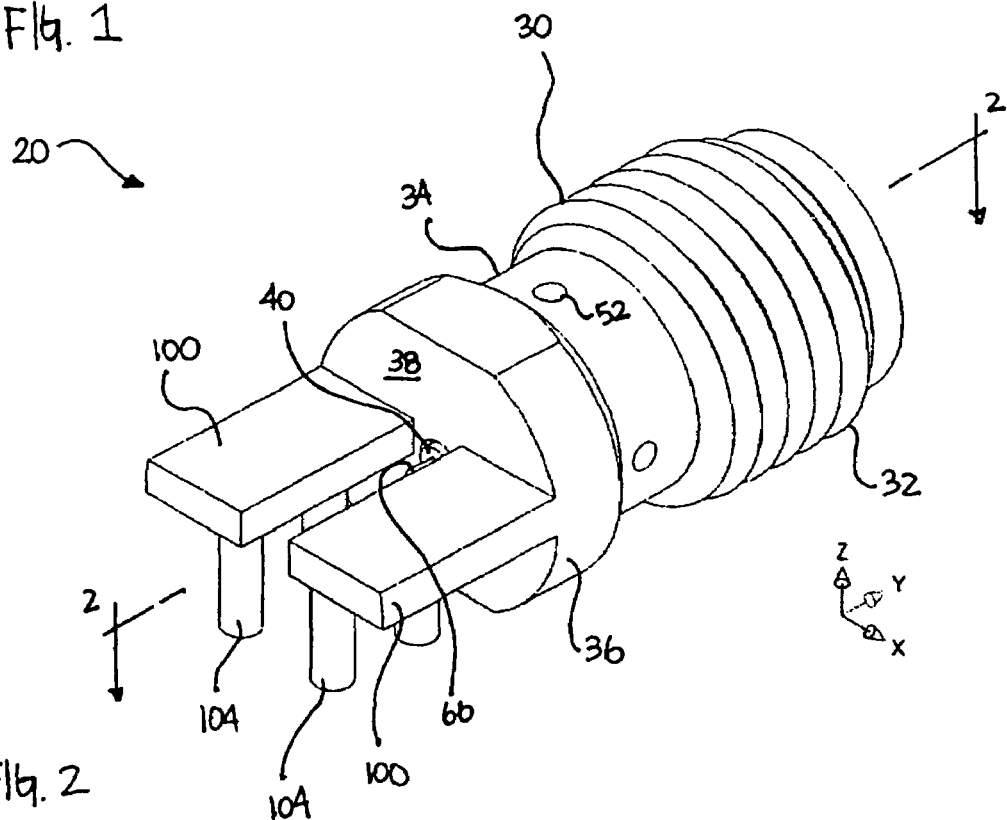
FIG. 1 depicts a perspective view of a high frequency edge mount connector, according to one embodiment.

It should be appreciated that for simplicity and clarity of illustration, elements shown in the Figures have not necessarily been drawn to scale. For example, the dimensions of some of the elements are exaggerated relative to each other for clarity. Further, where considered appropriate, reference numerals have been repeated among the Figures to indicate corresponding elements.

DETAILED DESCRIPTION OF THE PREFERRED EMBODIMENTS

While the present invention may be embodied in many different forms, there is shown in the drawings and discussed herein a few specific embodiments with the understanding that the present disclosure is to be considered only as an exemplification of the principles of the invention and is not intended to limit the invention to the embodiments illustrated.

The present invention describes an edge mount connector for high frequency signals that is capable of achieving both low a return loss and insertion loss. The connector includes a housing that forms an opening and a signal carrier in the housing. The signal carrier has a pin which extends through the opening. The connector also includes an insulator in the housing and surrounding the signal carrier, wherein the insulator has a outer portion surrounding the pin and extending through the opening. By extending the insulator through the opening, a tight seal can be created when the connector is pressed against a circuit board. The seal allows for improved impedance matching for a signal traveling between the connector and the circuit board.

In one embodiment, the insulator forms a step structure around the signal carrier. The step structure allows for the connector to better match the electromagnetic field distribution of a signal traveling through the connector in order to keep discontinuity reactances small. Additionally, the step structure helps match impedances and other interface discontinuity reactances for a high frequency signal traveling through the connector. Minimizing the discontinuity reactances for a high frequency signal traveling through the connector is desired rather than just compensating for them. Compensation may limit the usable frequency range of the connector, if the reactances are too large.

In one embodiment, the connector design incorporates an internal matched impedance transition from a large input coaxial connector interface, such as SMA, to a small coaxial output matched to the size of a high frequency substrate. The internal transition between the input coaxial connector interface and the small coaxial output consists of one or more graduated coaxial diametrical step sections, each optimized with inductive offsets to reduce the capacitive discontinuities created by the change in coaxial diameters. As shown in FIGS. 17A-17C, using multiple coaxial step sections to match the coaxial output of the edge mount connector to the size of the circuit board, reduces the overall effect of the discontinuities, thereby increasing the usable frequency range of the edge mount connector.

In one embodiment, the connector includes a projecting arm which is connected to the housing. The projecting arm is connected in such a way that the distance from a bottom surface of the housing to a bottom surface of the pin is within ±10% of the distance from the bottom surface of the housing to a bottom surface of the projecting arm. This allows for the projecting arm to protect the pin from damage when positioning the pin on a circuit board. Additionally, in one embodiment, the connector includes a ground post extending from the projecting arm. The ground post is adapted to mate with a hole formed through the circuit board. Not only does the ground post help ground the connector to the circuit board, but the ground post also helps align the pin to a signal trace on the circuit board.

Referring to FIG. 1, there is shown a perspective view of a high frequency edge mount connector 20, according to one preferred embodiment. The edge mount connector 20 includes a housing 30 forming an opening 50, a signal carrier 60 in the housing 30, and an insulator 40 in the housing 30 and surrounding the signal carrier 60, as illustrated in FIGS. 1-4. The housing 30 is preferably formed from a conductive material, such as stainless steel, copper, silver, gold, aluminum, brass, or any other material which can be used to shield a signal. The opening 50 is formed through the housing 30 and at one end of the housing 30 to allow for at least a portion of the signal carrier 60 to extend through the housing 30. The housing includes a threaded end 32 opposed to a connecting end 36. The threaded end 32 is adapted to mate with a threaded connector (not shown) attached to a signal line (not shown) which is used to carry a signal to the edge mount connector 20. The connecting end 36 includes an mating plane 38 which is designed to abut against an edge of a circuit board when the edge mount connector 20 is connected with a circuit board. The opening 50 is formed within the connecting end 36, and more specifically formed through the mating plane 38 of the connecting end 36, as illustrated in FIG. 1. The housing 30 also includes a transitional body 34 in between the threaded end 32 and the connecting end 36.

The transitional body 34 includes at least one stake 52 which is formed in the transitional body 34 creating a bulge which presses against the insulator 40 and is used to prevent the insulator 40 from moving out of the housing 30. The stake 52 is a distance $D_3$ from the mating plane 38. Preferably, the distance $D_3$ is between 2.5 to 3.5 mm. As illustrated in FIG. 5, the stake 52 is formed in the transitional body 34 a distance $D_3$ from a surface 35 of the transitional body 34 to a bottom surface 54 of the stake 52. Additionally, as illustrated in FIG. 5, sidewalls of the stake 52 are formed an angle A with respect to a perpendicular of the surface 35 of between 20° and 40°.

Figure 2:
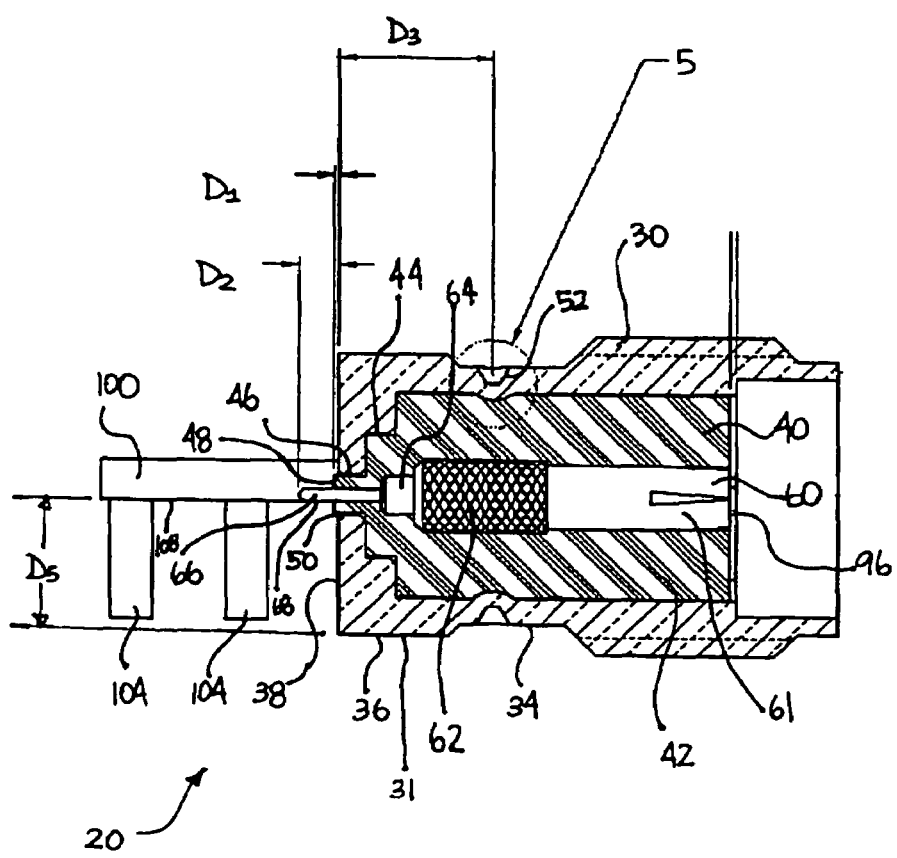
FIG. 2 depicts a cross sectional view along line 2-2 of the high frequency edge mount connector of FIG. 1.

Referring to FIG. 2, the signal carrier 60 includes a large input coaxial connector 62 connected to a small coaxial output or pin 66 through a step section 64. The pin 66 extends through the opening 50 of the housing 30, as illustrated in FIG. 2. The signal carrier 60 receives a signal at the large input coaxial connector 62 and channels the signal to the pin 66 through the step section 64. The diameter of the large input coaxial connector 61 is larger than the diameter of the step section 64 and the diameter of the step section is larger than the diameter d of the pin 66. By transitioning the signal from the large input coaxial connector 62 to the pin 66, by giving the pin 66 a smaller diameter than the large input coaxial connector 61, and by giving the step section a diameter larger than the pin 66 but smaller than the large input coaxial connector 61, the overall effect of discontinuities can be reduced within the edge mount connector 20, thereby increasing the usable frequency range of the edge mount connector 20.

Figure 18:
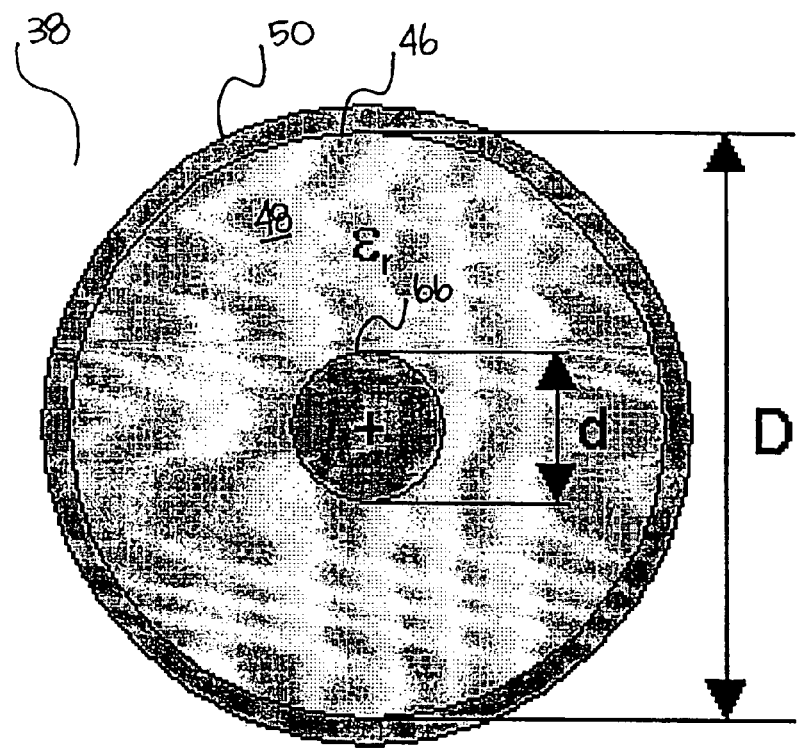
FIG. 18 depicts an enlarged cross-sectional view of a coaxial transmission line, according to one embodiment.

The pin 66 has a diameter d, as illustrated in FIG. 18, that is preferably between 125 and 1270 microns, and more preferably between 180 and 760 microns, and most preferably between 250 and 380 microns. The pin 66 extends through the opening 50 a distance $D_2$, as illustrated in FIG. 2. Preferably the distance $D_2$ is more than twice the diameter d of the pin 66. In one embodiment, the distance $D_2$ is between 125 and 1900 microns, and more preferably between 375 and 1250 microns, and most preferably between 500 and 1000 microns. The signal carrier also includes a knurled section 62 in between the step section 64 and the large input coaxial connection 61, as illustrated in FIG. 2. The knurled section 62 helps to lock the signal carrier 60 and the pin 66 into the insulator 40. The knurled section 62 captivates the signal carrier 60, which is optimized to maintain proper design impedance while withstanding a minimum of 28 millinewton-meter (mN-m) of applied torque and 26.7 newtons (N) of axial force.

Figure 6:
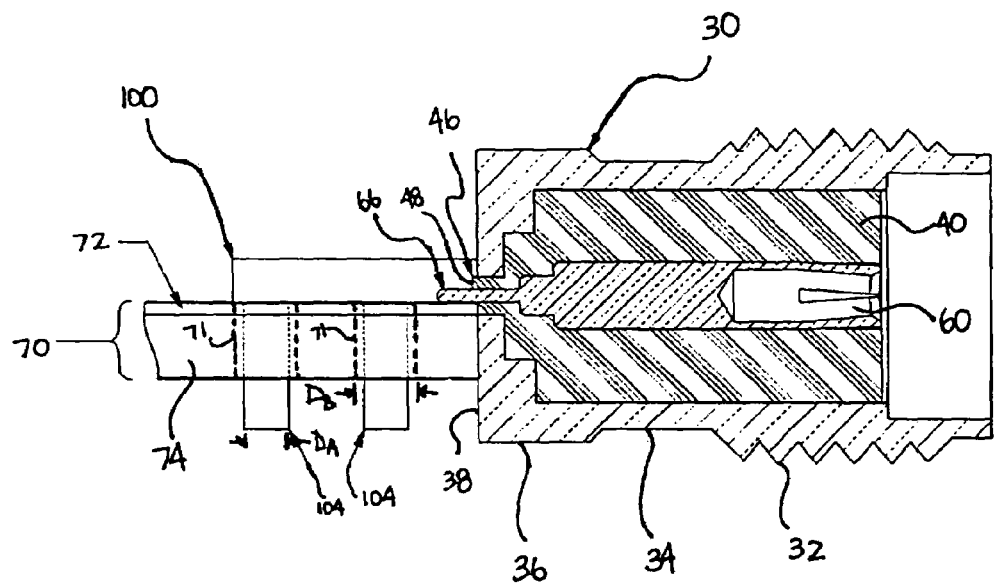
FIG. 6 depicts a cross-sectional view of a high frequency edge mount connector connected to a hybrid circuit board, according to one embodiment.
Figure 7:
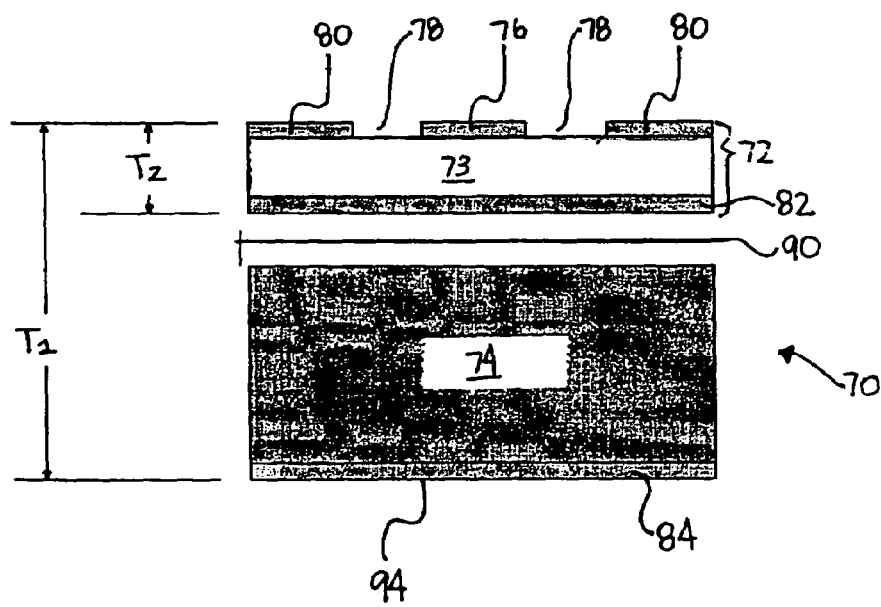
FIG. 7 depicts an expanded cross-sectional view of a hybrid circuit board, according to one embodiment.
Figure 8:
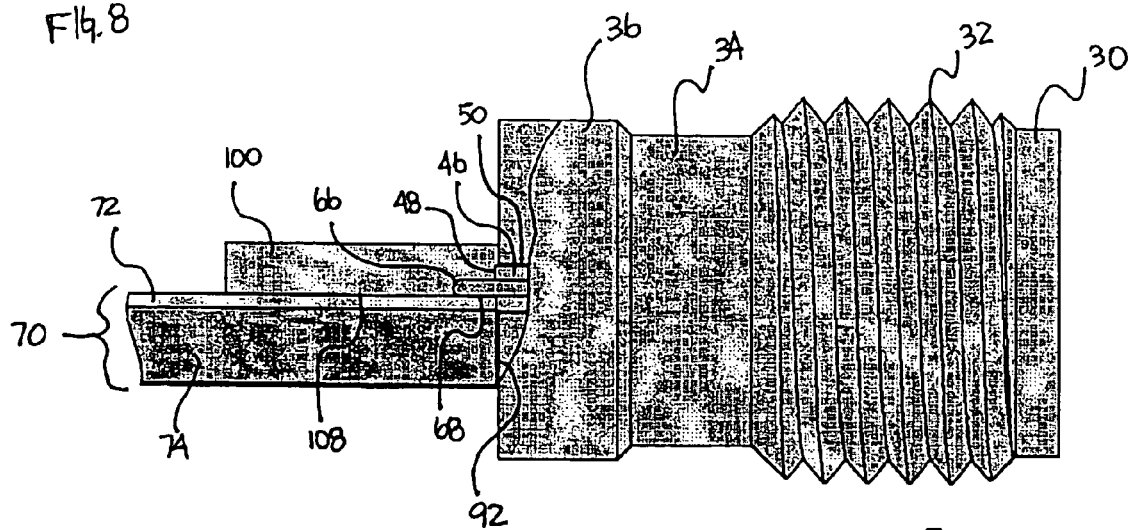
FIG. 8 depicts a partial cross-sectional side view of a high frequency edge mount connector connected to a hybrid circuit board, according to one embodiment.

The edge mount connector 20, and more specifically, the pin 66, is designed to be connected with a circuit board, such as a hybrid circuit board 70, as illustrated in FIGS. 6-9. The hybrid circuit board 70 includes a grounded co-planar waveguide 72 on a glass epoxy or similar low frequency substrate 74, as illustrated in FIG. 7. Although using a grounded co-planar waveguide, such as the grounded co-planar waveguide 72, is the preferred transmission line structure for the hybrid circuit board 70, other transmission lines may be used such as a microstrip. Preferably, the thickness $T_1$ of the hybrid circuit board 70 is between 800 and 2350 microns, and more preferably, between 1050 and 1700 microns. Preferably, the thickness $T_2$ of the grounded co-planar waveguide 72 is between 100 and 800 microns, and more preferably, between 200 and 500 microns. The grounded co-planar waveguide 72 is designed to handle signals with frequencies above 2 gigahertz, and preferably, signals with frequencies between 2 gigahertz and 30 gigahertz, and more preferably, between 5 gigahertz and 26.5 gigahertz.

The grounded co-planar waveguide 72 includes a first and second ground layers 80, 82 and a trace 76 on a high frequency substrate 73. Preferably, the high frequency substrate 73 comprises a material able to deal with high frequencies such as hydrocarbon thermos and/or ceramic filled PTFE composite laminate materials. Examples of such materials include PTFE glass fiber, PTFE ceramic, PTFE woven glass, PTFE ceramic reinforced woven glass, and hydrocarbon ceramic.

The signal trace 76 is formed on the high frequency substrate 73. The signal trace 76 is designed to carry a high frequency signal on the surface of the high frequency substrate 73. The first ground layer 80 is formed on the high frequency substrate 73 and on both sides of the signal trace 76, for grounding the edge mount connector 20. A gap 78 is formed between the trace and the first ground layer 80. The gap 78 provides some clearance between the signal trace 76 and the first ground layer 80. The second ground layer 82 is formed on a side of the high frequency substrate 73 opposed to the first ground layer 80, as illustrated in FIG. 7. An FR4 preppreg layer 90 is formed between the grounded co-planar waveguide 72 and the low frequency substrate 74. Preferably, the substrate 74 comprises woven glass cloth material such as FR-4 glass epoxy.

Preferably, a conductive layer 84 is formed on one side of the low frequency substrate 74. Via holes 86 plated with conductive material 88 are formed through the high frequency substrate 73 and connect the first ground layer 80 to the second ground layer 82.

Referring to FIG. 2, the insulator 40 is located in the housing 30 and surrounding the signal carrier 60. The insulator 40 comprises an insulating material, such as, Polyethylene, DE-3401, Polyhexamethyleneadipamide (Nylon), Polystyrene, PolyTetraFluoroEthylene (Teflon™), foamed Polyethylene, polymers, ceramics, and other such materials. Preferably, insulator 40 comprises PTFE or Teflon™, since PTFE has a low dielectric constant, has good electrical stability through a fairly wide range of temperatures and frequencies, and is also relatively easy to machine and mold.

Preferably, insulator 40 comprises a material that has a dielectric constant which is fairly constant over a wide bandwidth, making it easier to match the impedances between the edge mount connector 20 and the grounded co-planar waveguide 72 over a wide bandwidth. Preferably, insulator 40 comprises a material that has a dielectric constant which varies no more than ±10% over a frequency range between 2 to 30 gigahertz, and more preferably, no more than ±5% over a frequency range between 5 to 26.5 gigahertz.

Insulator 40 includes an inner portion 42 surrounding the large input coaxial connector 61 of the signal carrier, an intermediate portion 44 surrounding the step section 64 of the signal carrier 60, and an outer portion 46 surrounding at least a portion of the pin 66 of the signal carrier 60. The inner portion 42 has a diameter that is greater than a diameter D of the outer portion 46. The intermediate portion 44 has a diameter that is less than the diameter of the inner portion 42 but greater than the diameter D of the outer portion 46. The diameter of the inner portion 42 is related to the diameter of the large input coaxial connector 61, the diameter of the intermediate portion 44 is related to the diameter of the step section 64, and the diameter D of the outer portion 46 is related to the diameter d of the pin 66. By gradually reducing the diameter of the insulator 40 from the inner portion 42 to the outer portion 46, and by relating the diameters of the outer portion 46, the intermediate portion 44, and the inner portion, to the diameters of the large input coaxial connector 61, the step section 64, and the pin 66, respectively, and essentially forming a structure which generally mimics and is related to the shape of the structure of the signal carrier 60, the overall effect of discontinuities can be reduced within the edge mount connector 20, thereby increasing the usable frequency range of the edge mount connector 20.

The outer portion 46 surrounds the pin 66 and extends through the opening 50, as illustrated in FIG. 2, a distance $D_1$. Preferably the distance $D_1$ is less than half the diameter d of the pin 66. In one embodiment the distance $D_1$ is less than 250 microns, and preferably less than 175 microns, and more preferably less than 125 microns. The pin 66 and extends through the opening 50, as illustrated in FIG. 2, a distance $D_2$. The distance $D_1$ is less than the distance $D_2$. By extending the outer portion 46 through the opening 50, the high frequency edge mount connector 20 is capable of interfacing with the grounded co-planar waveguide 72 without any air gap in between or leaving a minimal amount of gap in between the edge mount connector 20 and the hybrid circuit board 70, as illustrated in FIGS. 6 and 6A. Once attached to and pressed against the grounded co-planar waveguide 72, as illustrated in FIGS. 6 and 6A, a bottom portion of the outer portion 46 deforms so that the bottom portion of the outer portion 46 extends through the opening 50 a distance $D_8$ which is less than the distance $D_1$.

The outer portion 46 has a diameter D which is related to the diameter d of the pin 66 based upon the following factors: 1) the permeability of freespace, 2) the relative permeability for non-magnetic insulators, 3) the permittivity of freespace, 4) the relative permittivity or the dielectric constant of the insulator 40, and 5) an impedance $Z_1$ of the edge mount connector 20 and an impedance $Z_2$ of the grounded co-planar waveguide 72. The outer portion 46 has a diameter D which is related to the diameter d of the pin 66 through the following equation:

$$Z_1 = \frac{1}{2\pi}\sqrt{\frac{\mu_o \mu_r}{\varepsilon_o \varepsilon_r}} \ln\left(\frac{D}{d}\right), \quad [1]$$

wherein $\mu_o$ represents the permeability of freespace, $\mu_r$ represents the relative permeability for non-magnetic insulators, $\varepsilon_o$ represents the permittivity of freespace, and $\varepsilon_r$ represents the relative permittivity or the dielectric constant of the insulator 40.

Figure 19:
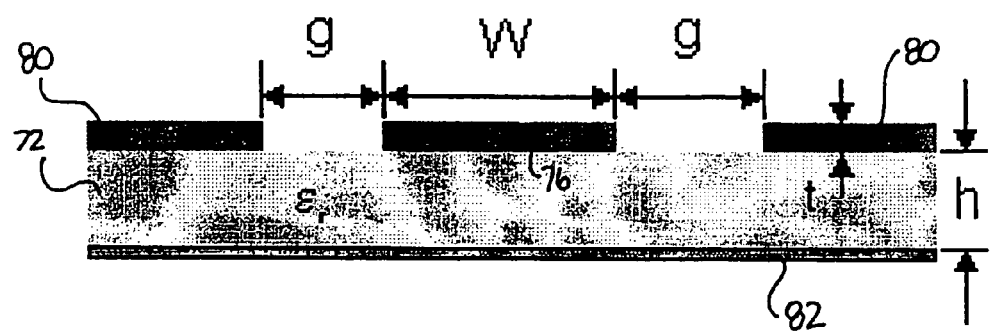
FIG. 19 depicts an enlarged cross-sectional view of a grounded coplanar waveguide transmission line, according to one embodiment.

Preferably, the impedance $Z_1$ of the edge mount connector 20 is within ±5% of the impedance $Z_2$ of the grounded co-planar waveguide 72. The impedance $Z_2$ of the grounded co-planar waveguide 72 is determined by the thickness h of the high frequency substrate 73, the gap g between the signal trace 76 and the first ground layer 80, the thickness t of the signal trace 76 and/or the first ground layer 80, the width w of the signal trace 76, and the relative permittivity or Dielectric Constant $\varepsilon_r$ of the high frequency substrate 73, as illustrated in FIG. 19. The impedance $Z_2$ may be determined by using a program published by Eagleware Corporation of Norcross, Ga., called "T-Line™" which calculates the variables for a grounded co-planar waveguide 72, such as the thickness h of the high frequency substrate 73, the gap g between the signal trace 76 and the first ground layer 80, the thickness t of the signal trace 76 and/or the first ground layer 80, the width w of the signal trace 76, and the relative permittivity or Dielectric Constant $\varepsilon_r$ of the high frequency substrate 73, so that the impedance $Z_2$ of the grounded co-planar waveguide 72 can match or come within ±5% of the impedance $Z_1$ of the edge mount connector 20.

For reference, the analytical equation for approximating the impedance $Z_2$ of the grounded co-planar waveguide 72 is provided as follows:

$$Z_2 = \sqrt{\frac{\mu_o}{\varepsilon_o}} \frac{1}{2\sqrt{\varepsilon_{\text{eff}}}} \frac{1}{\frac{K(k)}{K(k')} + \frac{K(k_1)}{K(k'_1)}} \quad [2]$$

Where K(f)/K(f') is a ratio of complete elliptical integrals of the first kind (f and f' are generic functions), and:

$$k = w/(w + 2g) \quad [3]$$

$$k' = \sqrt{1-k^2} \quad [4]$$

$$k'_1 = \sqrt{1-k_1^2} \quad [5]$$

$$k_1 = \frac{\tanh\left(\frac{\pi w}{4h}\right)}{\tanh\left(\frac{\pi(w+2g)}{4h}\right)} \quad [6]$$

$$\varepsilon_{\text{eff}} = \frac{1 + \varepsilon_r \frac{K(k')}{K(k)} \frac{K(k_1)}{K(k'_1)}}{1 + \frac{K(k')}{K(k)} \frac{K(k_1)}{K(k'_1)}} \quad [7]$$

Additionally, relative dielectric constants of some common electronic circuit insulating materials at frequencies of less than 1 gigahertz are provided in the Table 1 below, for reference.

TABLE 1

| Material | Dielectric Constant (<1 GHz) |
|---|---|
| Air | 1.0 |
| Alumina, 99.5% | 10 |
| G10/FR4 Epoxy glass | 4.8 (varies) |
| Polyethylene, DE-3401 | 2.26 |
| Polyhexamethyleneadipamide (Nylon) | 2.9 |
| Polyolefin, irradiated | 2.32 |
| Polystyrene | 2.53 |
| Polystyrene, cross linked | 2.53 |
| Polystyrene, glassed cross linked | 2.62 |
| PolyTetraFluoroEthylene (Teflon) | 2.10 |
| Polyvinal formal (Formvar) | 2.8 |
| PTFE, glass microfiber | 2.35 |
| PTFE (High Frequency Teflon)* | 2.0 |
| PTFE, woven glass | 2.55 |
| PTFE, woven quartz | 2.47 |
| Pyrex glass | 4.84 |
| Quartz, fused | 3.8 |
| RT/Duroid | 2.20 |
| RT/Duroid, PTFE ceramic filled | 10.5 |
| Water, distilled | 77 |

*Greater than 1 ghz

Referring to FIG. 6A, the outer portion 46 forms a layer having a thickness $T_3$ around the pin 66. Preferably, the thickness $T_3$ of the outer portion 46 is equal to or within ±30%, and more preferably, within ±15% of the thickness $T_2$ of the grounded co-planar waveguide 72. In one embodiment, the thickness $T_3$ of the outer portion 46 is equal to or within ±30%, and more preferably, within ±15% of the thickness h of the high frequency substrate 73. Once the material for the insulator 40 is determined, the diameter d of the pin 66 can be determined using the above equations to match the impedance $Z_1$ of the edge mount connector 20 to the impedance $Z_2$ of the grounded co-planar waveguide 72. Once the diameter d of the pin 66 is determined, then the width w of the signal trace 76 can be determined. The width w of the signal trace 76 and the gaps g between the signal trace 76 and the first ground layer 80 are then balanced in order to match the impedance $Z_1$ of the edge mount connector 20 to the impedance $Z_2$ of the grounded co-planar waveguide 72, and geometrically matched in size to the edge mount connector 20 for a "clean" high frequency transition between the edge mount connector 20 and the hybrid circuit board 70.

In one embodiment, the edge mount connector 20 comprises a projecting arm 100 connected with the housing 30, and more specifically connected with an mating plane 38 of the connecting end 36, as illustrated in FIGS. 1 thru 3. The projecting arm 100 has a bottom surface 108 which is essentially level with a bottom surface 68 of the pin 66, as illustrated in FIG. 2. Preferably a distance $D_5$ from a bottom surface 31 of the housing 30 to a bottom surface 68 of the pin 66 is within plus or minus 10% of the distance from the bottom surface 31 of the housing 30 to a bottom surface 108 of the projecting arm 100. In this way, when the edge mount connector 20 is mounted onto a hybrid circuit board 70, as illustrated in FIG. 6, the projecting arm 100 is able to prevent the pin 66 from deforming and also able to help align the pin 66 with the surface of the hybrid circuit board 70.

Figure 9:
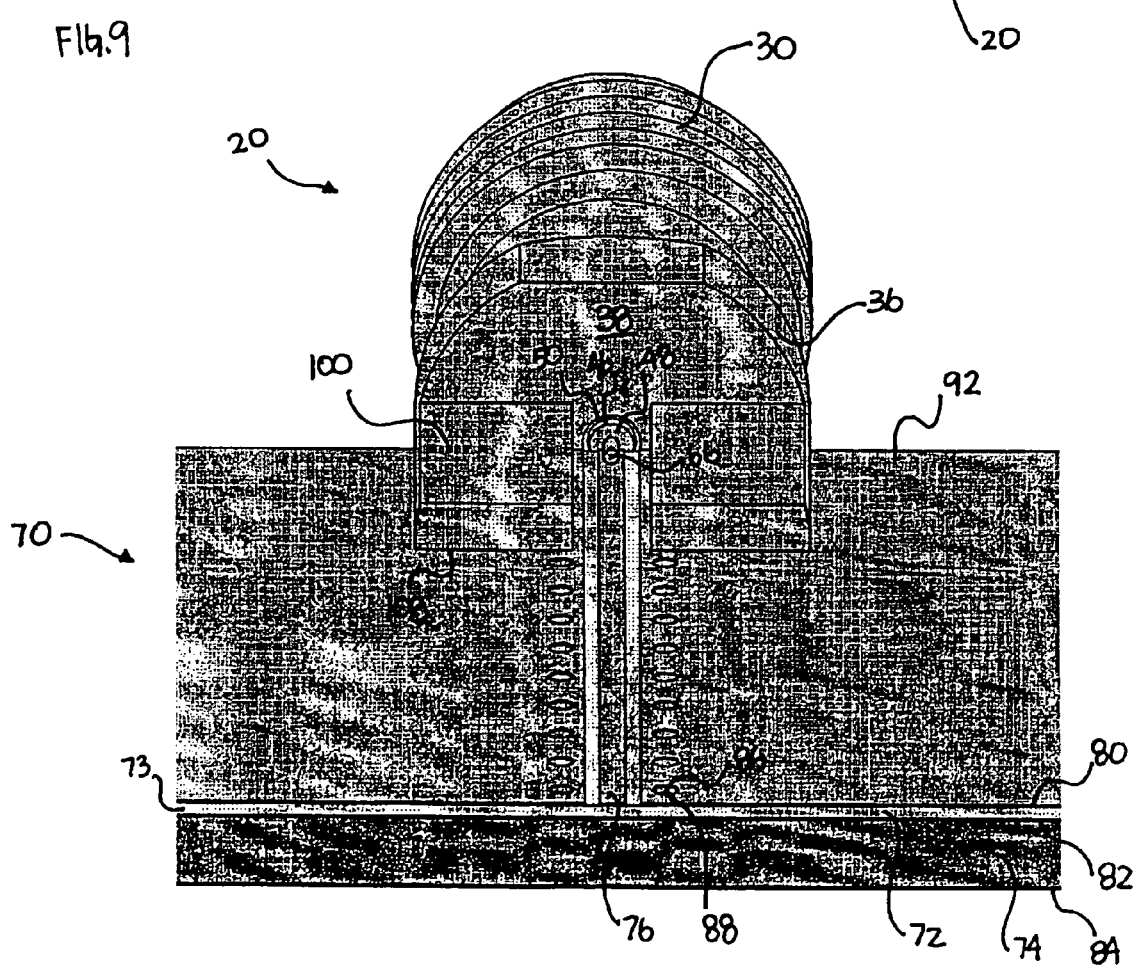
FIG. 9 depicts front perspective view of a high frequency edge mount connector connected to a hybrid circuit board, according to one embodiment.

In one embodiment the edge mount connector 20 comprises a ground post 104 extending from the projecting arm 100, as illustrated in FIGS. 1-4. The ground post 104 is adapted to mate with a hole 71 formed in a hybrid circuit board 70, as illustrated in FIG. 6. By using a grounding post 104 along with a projecting arm 100, the edge mount connector 20 is able to precisely align the pin 66 with the hybrid circuit board 70 and more specifically with a signal trace 76 on the hybrid circuit board 70, as illustrated in FIG. 9. Preferably the ground post 104 has a diameter $D_A$ which is less than a diameter $D_B$ of the hole 71 formed in the hybrid circuit board 70, and more preferably, the diameter $D_A$ of the ground post 104 is not more than 80% of the diameter $D_B$ of the hole formed in the hybrid circuit board 70. By giving the ground post 104 a diameter $D_A$ which is less than a diameter $D_B$ of the hole 71, the edge mount connector 20, and more specifically, the pin 66, is able to be more accurately positioned on the hybrid circuit board 70.

To assemble the connector 20 to the circuit board 70, it is recommended to position connector 70 on the circuit board 70, making sure the pin 66 is aligned with the center of the signal trace 76, adjust the connector 20 such that it is held tightly against both the edge of the board and the top (signal side) of the board, thereby compressing insulator 40 against the board edge (the axis of the connector should preferably be held parallel to the plane of the circuit board). Next the ground legs are soldered to the signal side ground plane, the pin is soldered 66 to the trace 76 (using a minimal amount of solder) and, if necessary excess solder is removed and flux residues are removed from the trace area.

Figure 14:
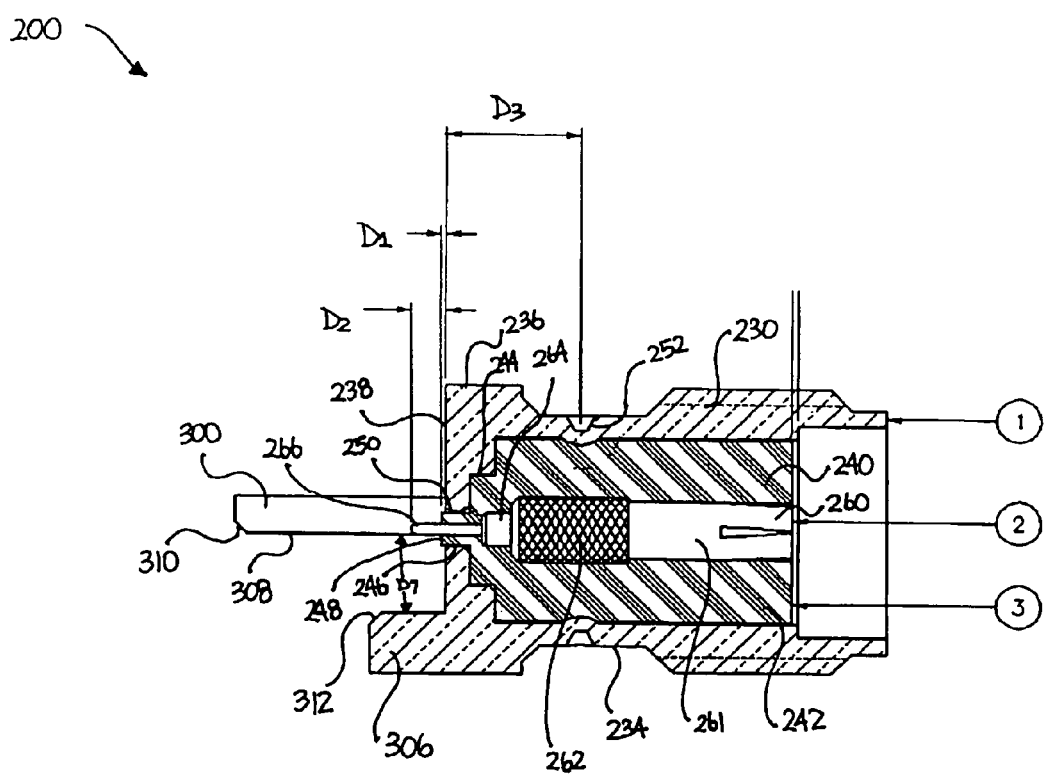
FIG. 14 depicts a cross sectional view along line 14-14 of the high frequency edge mount connector of FIG. 13.
Figure 15:
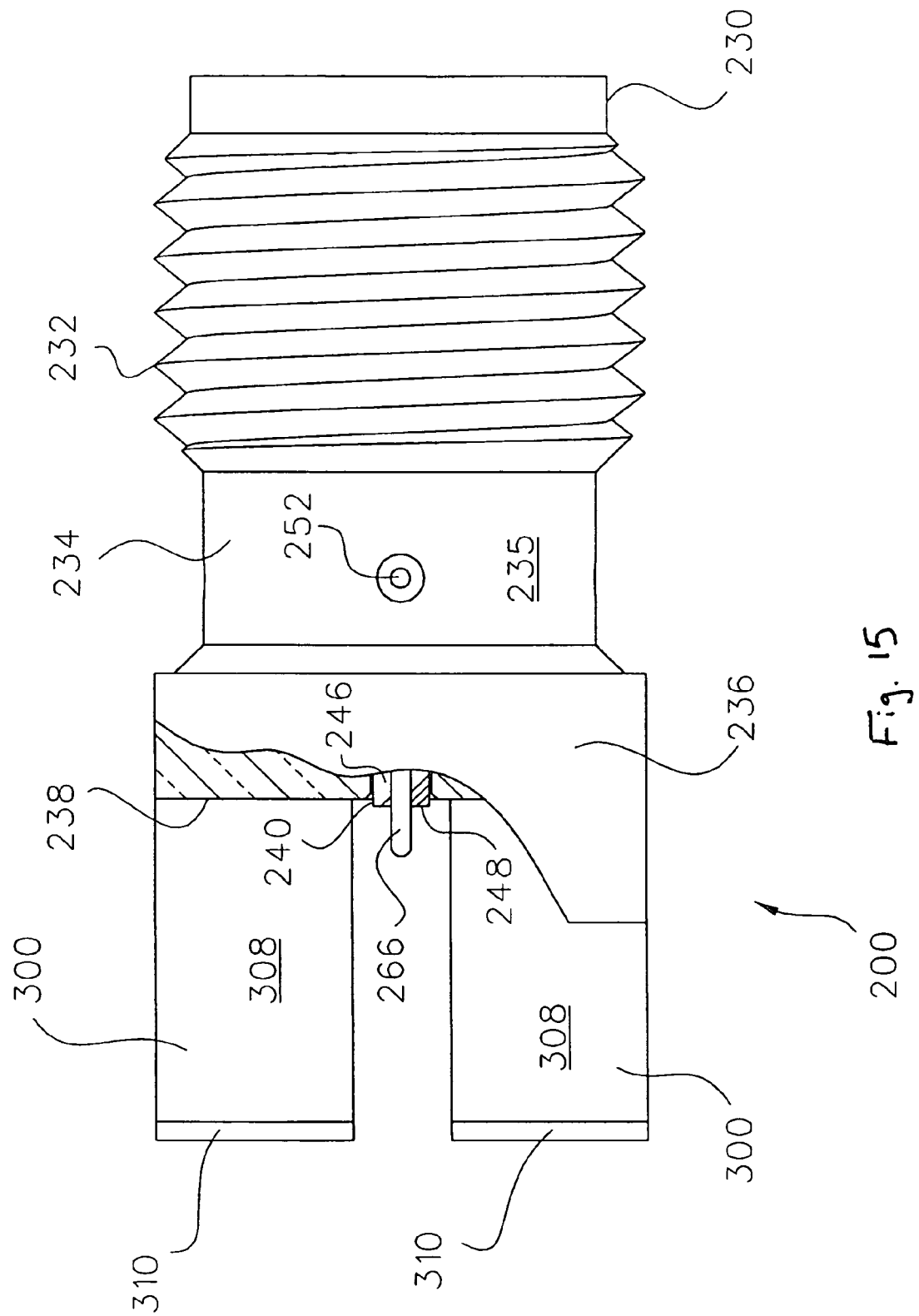
FIG. 15 depicts a partial cross-sectional bottom view of the high frequency edge mount connector of FIG. 13, according to one embodiment.
Figure 16:
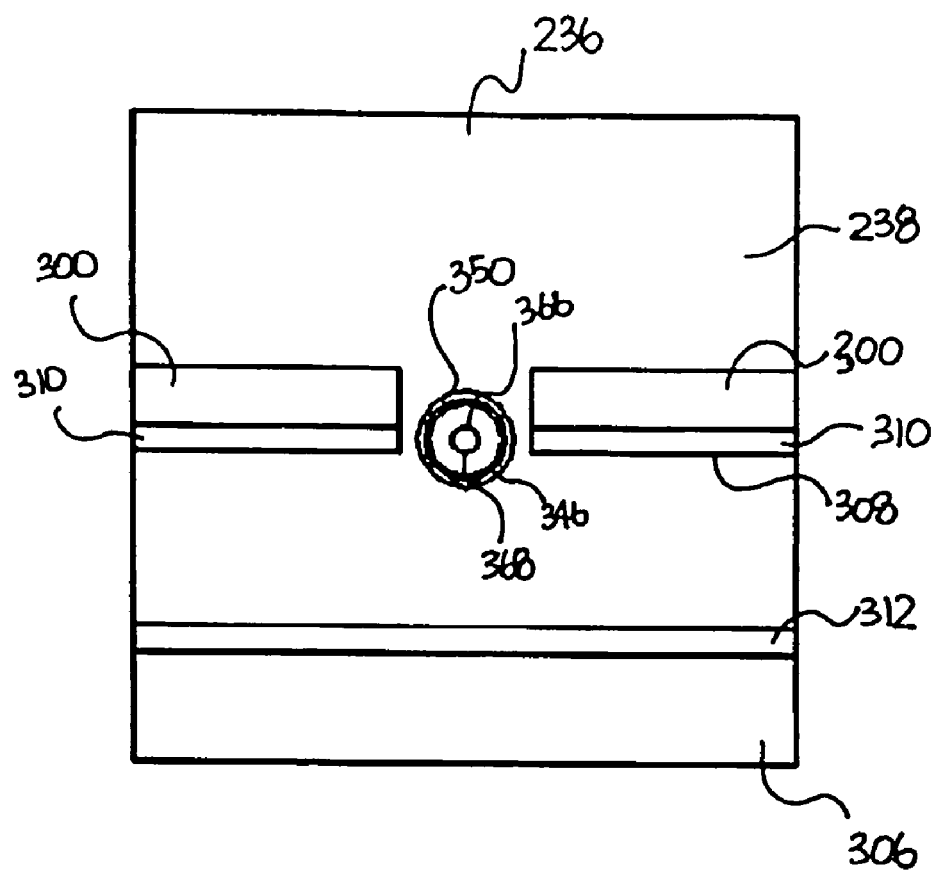
FIG. 16 depicts a front view of the high frequency edge mount connector of FIG. 13, according to one embodiment.

Referring to FIGS. 14-16, there is shown a perspective view of a high frequency edge mount connector 200, according to one preferred embodiment. Elements within edge guide connector 220 that correspond to like elements found in edge guide connector 20 have element numbers which are increased by a value of 200, for simplicity. Edge mount connector 200 includes an edge guide 306 connected with a housing 230, wherein the edge guide 306 is located a distance $D_7$ from a projecting arm 300, as illustrated in FIGS. 14-16. Preferably, the distance $D_7$ is equal to or greater than a thickness $T_1$ of the hybrid circuit board 70. The edge guide 306 projects out from a mating plane 238 of the housing 230 in a similar direction as the projecting arm 300. By using the edge guide 306, the edge mount connector 200 is able to be mounted onto and positioned on the hybrid circuit board 70 without additional hardware.

Figure 10:
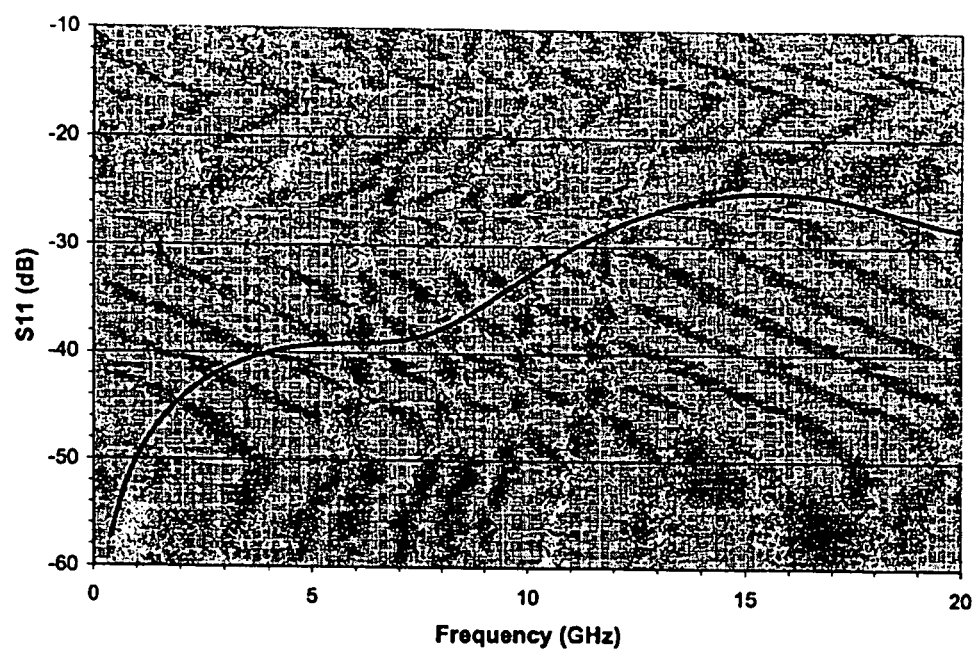
FIGS. 10-12 are graphs which chart the high frequency electrical performance of a high frequency edge mount connector, according to one embodiment.
Figure 11:
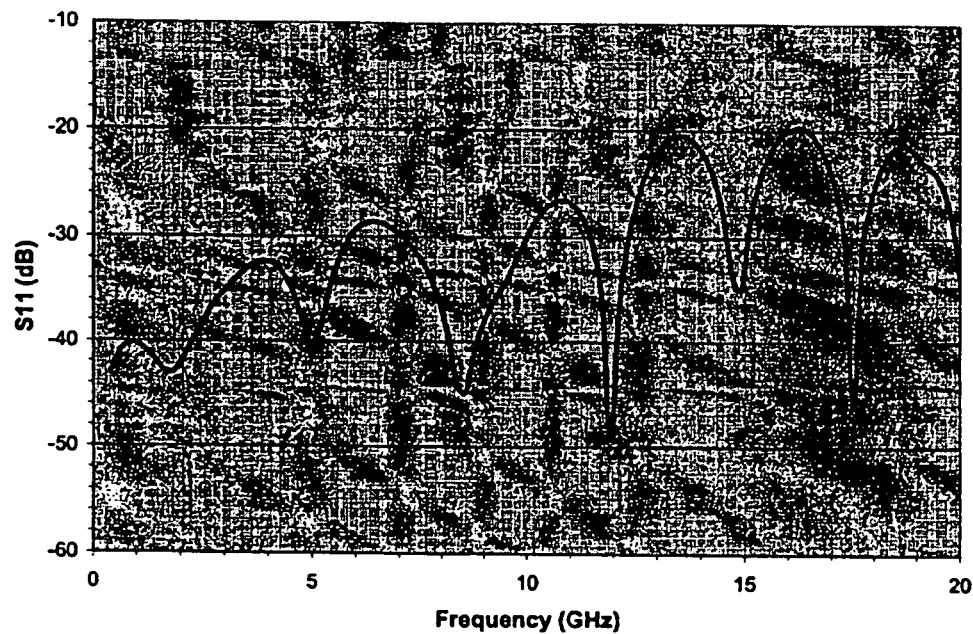
Figure 12:
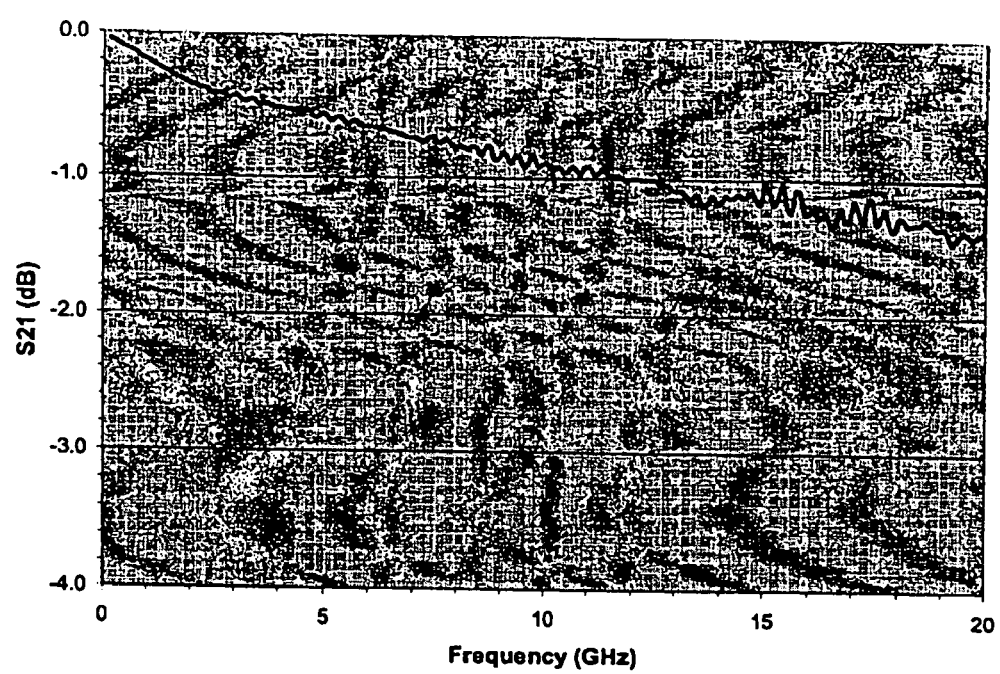
Figure 13:
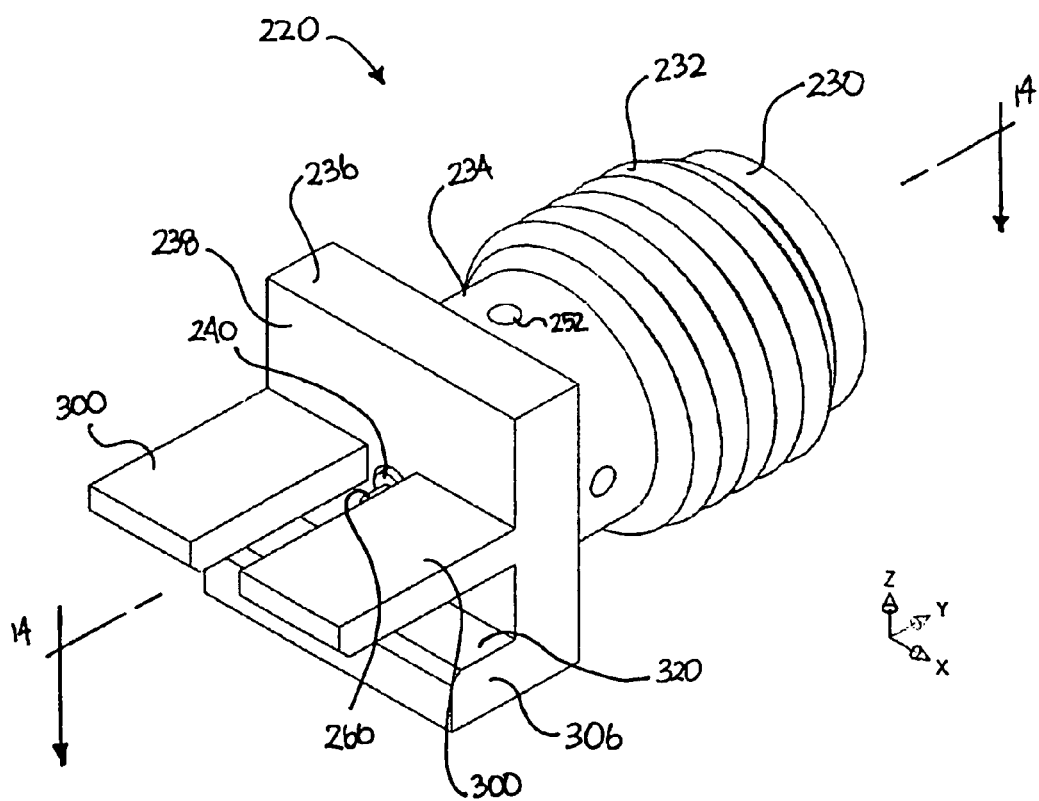
FIG. 13 depicts a perspective view of a high frequency edge mount connector, according to one embodiment.

The data shown in FIGS. 5-7 charts the high frequency electrical performance of the edge mount connector 20 shown in FIG. 1. To generate the test data, two identical edge mount connectors 20 were connected back to back on a 31.75 millimeter long signal trace of a grounded coplanar waveguide, fabricated on a Rogers RO4003® high frequency substrate 73 having a thickness of about 203 microns. The grounded coplanar waveguide signal trace was 406 microns wide and 25 microns thick, with 254 micron wide ground gaps. The ground via holes had diameters of 406 microns, spaced close to the gaps at intervals of 1.27 millimeters on both sides of the grounded coplanar waveguide structure, as shown in FIG. 9. FIG. 10 graphs the return loss in dB of a single edge mount connector 20, including the transition to the grounded coplanar waveguide structure, verses the frequency of the signal in gigahertz. FIG. 11 graphs the return loss in dB of two edge mount connectors 20, including the transition to the grounded coplanar waveguide structure and the 31.75 millimeter long signal trace of a grounded coplanar waveguide, verses the frequency of the signal in gigahertz. FIG. 12 graphs the insertion loss in dB of two edge mount connectors 20, including the transition to the grounded coplanar waveguide structure and the 31.75 millimeter long signal trace of a grounded coplanar waveguide, verses the frequency of the signal in gigahertz.

Although the foregoing detailed description of the present invention has been described by reference to one or more exemplary embodiments, and the best mode contemplated for carrying out the present invention has been shown and described, it will be understood that modification or variations in the structure and arrangement of this embodiment other than those specifically set forth herein may be achieved by those skilled in the art and that such modifications are to be considered as being within the overall scope of the present invention. Therefore, it is contemplated to cover the present invention and any and all modifications, variations, equivalents that fall with in the true spirit and scope of the underlying principles disclosed and claimed herein. Consequently, the scope of the present invention is intended to be limited only by the attached claims.

What is claimed is:

1. A high-frequency edge mount connector comprising:
   a housing forming an opening;
   a signal carrier in the housing, the signal carrier having a pin which extends through the opening; and
   an insulator in the housing and surrounding the signal carrier, wherein the insulator has a outer portion surrounding the pin and extending through the opening.

2. The device of claim 1 further comprising a projecting arm connected with the housing.

3. A high-frequency edge mount connector comprising:
   a housing forming an opening;
   a signal carrier in the housing, the signal carrier having a pin which extends through the opening;
   an insulator in the housing and surrounding the signal carrier, wherein the insulator has a outer portion surrounding the pin and extending through the opening;
   a projecting arm connected with the housing; and
   a ground post extending from the projecting arm.

4. A high-frequency edge mount connector comprising:
   a housing forming an opening;
   a signal carrier in the housing, the signal carrier having a pin which extends through the opening;
   an insulator in the housing and surrounding the signal carrier, wherein the insulator has a outer portion surrounding the pin and extending through the opening;
   a projecting arm connected with the housing; and
   an edge guide connected with the housing, wherein the edge guide is located a distance away from the projecting arm.

5. A high-frequency edge mount connector comprising:
   a housing forming an opening;
   a signal carrier in the housing, the signal carrier having a pin which extends through the opening; and an insulator in the housing and surrounding the signal carrier, wherein the insulator has a outer portion surrounding the pin and extending through the opening, wherein the pin has a diameter d and the outer portion has a diameter D, and wherein the impedance of the edge mount connector is within ±10% of the impedance $Z_1$ determined by the following equation:

$$Z_1 = \frac{1}{2\pi}\sqrt{\frac{\mu_o\mu_r}{\varepsilon_o\varepsilon_r}}\ln\left(\frac{D}{d}\right),$$

wherein $\mu_o$ represents the permeability of freespace, $\mu_r$ represents the relative permeability for non-magnetic insulators, $\epsilon_o$ represents the permittivity of freespace, and $\epsilon_r$ represents the relative permittivity or the dielectric constant of the insulator.

6. A high-frequency edge mount connector comprising:
a housing forming an opening;
a signal carrier in the housing, the signal carrier having a pin which extends through the opening; and
an insulator in the housing and surrounding the signal carrier, wherein the insulator has a outer portion surrounding the pin and extending through the opening,
wherein the pin has a diameter d and the outer portion has a diameter D, and the diameter D of the outer portion is less than ten times the diameter d of the pin.

7. A high-frequency edge mount connector comprising:
a housing forming an opening;
a signal carrier in the housing, the signal carrier having a pin which extends through the opening; and
an insulator in the housing and surrounding the signal carrier, wherein the insulator has a outer portion surrounding the pin and extending though the opening,
wherein the outer portion surrounding the pin extends through the opening a distance $D_1$, the pin has a diameter d, and the distance $D_1$ is less than the diameter d.

8. A high-frequency edge mount connector comprising:
a housing forming an opening;
a signal carrier in the housing, the signal carrier having a pin which extends through the opening; and
an insulator in the housing and surrounding the signal carrier, wherein the insulator has a outer portion surrounding the pin and extending through the opening,
wherein the insulator comprises Teflon™.

9. A high-frequency edge mount connector comprising:
a housing forming an opening;
a signal carrier in the housing, the signal carrier having a pin which extends through the opening; and
an insulator in the housing and surrounding the signal carrier, wherein the insulator has a outer portion surrounding the pin and extending through the opening,
wherein the signal carrier has an large input coaxial connector in the housing and the insulator has an inner portion surrounding the signal carrier, wherein the inner portion has a diameter $D_A$ that is greater than a diameter $D_B$ of the outer portion.

10. The device of claim 8, wherein the insulator has an intermediate portion in between the inner portion and the outer portion, wherein the inner portion has a diameter $D_C$ that is less than the diameter $D_A$ of the inner portion but greater than the diameter $D_B$ of the outer portion.

11. A high-frequency edge mount connector comprising:
a housing forming an opening;
a signal carrier in the housing, the signal carrier having a pin which extends through the opening; and
an insulator in the housing and surrounding the signal carrier, wherein the insulator has a outer portion surrounding the pin and extending through the opening,
wherein the housing has a mechanical coupling end and a connecting end at an opposing end, wherein the transitional body forms the opening.

12. A high-frequency edge mount connector comprising:
a housing forming an opening;
a signal carrier in the housing, the signal carrier having a pin which extends through the opening; and
an insulator in the housing and surrounding the signal carrier, wherein the insulator has a outer portion surrounding the pin and extending through the opening,
wherein the housing has a transitional body in between the mechanical coupling end and the connecting end.

13. A high-frequency edge mount connector comprising:
a housing forming an opening;
a signal carrier in the housing, the signal carrier having a pin which extends through the opening; and
an insulator in the housing and surrounding the signal carrier, wherein the insulator has a outer portion surrounding the pin and extending through the opening, and
an edge guide connected with the housing.

14. A high-frequency edge mount connector comprising:
a housing forming an opening;
a signal carrier in the housing, the signal carrier having a pin which extends through the opening; and
an insulator in the housing and surrounding the signal carrier, wherein the insulator has a outer portion surrounding the pin and extending through the opening,
wherein the pin extends through the opening a distance $D_2$, the pin has a diameter d, and the distance $D_2$ is more than twice the diameter d.

15. A high-frequency edge mount connector comprising:
a housing forming an mating plane at one end;
a signal carrier in the housing, the signal carrier having a pin which extends through the mating plane;
a projecting arm connected with the mating plane, wherein the distance from a bottom surface of the housing to a bottom surface of the pin is within ±10% of the distance from the bottom surface of the housing to a bottom surface of the projecting arm; and
an insulator in the housing and surrounding the signal carrier, wherein the insulator has a outer portion surrounding the pin.

16. The device of claim 15 further comprising a ground post extending from the projecting arm.

17. The device of claim 15 further comprising an edge guide connected with the housing, wherein the edge guide is located a distance away from the projecting arm.

18. The device of claim 15, wherein the pin has a diameter d and the outer portion has a diameter D, and the impedance I of the signal carrier is within ±10% of the impedance Z determined by the following equation:

$$Z = \frac{1}{2\pi}\sqrt{\frac{\mu_o\mu_r}{\varepsilon_o\varepsilon_r}}\ln\left(\frac{D}{d}\right),$$

wherein $\mu_o$ represents the permeability of freespace, $\mu_r$ represents the relative permeability for non-magnetic insulators, $\epsilon_o$ represents the permittivity of freespace, and $\epsilon_r$ represents the relative permittivity or the dielectric constant of the insulator.

19. The device of claim 15, wherein the pin has a diameter d and the outer portion has a diameter D, and the diameter D of the outer portion is less than ten times the diameter d of the pin.

* * * * *